United States Patent
Etzler et al.

(10) Patent No.: US 9,761,783 B2
(45) Date of Patent: Sep. 12, 2017

(54) METHOD OF OPERATING A CAPACITIVE ACTUATOR IN A MOTOR VEHICLE

(71) Applicant: CONTINENTAL AUTOMOTIVE GMBH, Hannover (DE)

(72) Inventors: Dirk Etzler, Rochester Hills, MI (US); Walter Schrod, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 501 days.

(21) Appl. No.: 14/386,827

(22) PCT Filed: Mar. 19, 2013

(86) PCT No.: PCT/EP2013/055617
§ 371 (c)(1),
(2) Date: Sep. 22, 2014

(87) PCT Pub. No.: WO2013/139757
PCT Pub. Date: Sep. 26, 2013

(65) Prior Publication Data
US 2015/0048718 A1    Feb. 19, 2015

(30) Foreign Application Priority Data
Mar. 22, 2012 (DE) .................. 10 2012 204 576

(51) Int. Cl.
*H01L 41/04* (2006.01)
*F02D 41/20* (2006.01)
*H02N 2/06* (2006.01)

(52) U.S. Cl.
CPC ........ *H01L 41/042* (2013.01); *F02D 41/2096* (2013.01); *H02N 2/067* (2013.01);
(Continued)

(58) Field of Classification Search
CPC ... F02D 41/2096; H01L 41/042; H02N 2/067; H02N 2/06
See application file for complete search history.

(56) References Cited

U.S. PATENT DOCUMENTS 6,081,061 A    6/2000   Reineke et al.
7,812,503 B2  10/2010   Kakehi et al.
(Continued)

FOREIGN PATENT DOCUMENTS

CN   101443927 A    5/2009
DE    19927087 A1  12/2000
(Continued)

*Primary Examiner* — J. San Martin
(74) *Attorney, Agent, or Firm* — Laurence A. Greenberg; Werner H. Stemer; Ralph E. Locher

(57) ABSTRACT

A capacitive actuator is connected to an output of an apparatus which is formed with a capacitor connected between an input and a reference potential, with a full bridge with four power switching elements connected in parallel with the capacitor. To charge the capacitive actuator, a control circuit first turns on the first and third power switching elements. Current then flows from the first capacitor via a coil connected between the bridge paths and energy is stored in the coil. When a maximum current value is reached, the first and third power switching elements are switched off and magnetic energy stored in the coil decays due to current flow via the diodes of the second and fourth power switching elements. This charges the capacitive actuator. The capacitive actuator is charged to a predefined voltage by possible repeated switching of the first and third power switching elements.

2 Claims, 1 Drawing Sheet

(52) U.S. Cl.
CPC ............... *F02D 2041/2058* (2013.01); *F02D 2041/2072* (2013.01)

(56) References Cited

U.S. PATENT DOCUMENTS

| | | |
|---|---|---|
| 2005/0155580 A1 | 7/2005 | Rohatschek |
| 2009/0051247 A1* | 2/2009 | Kakehi .................. H02N 2/067 310/316.03 |
| 2009/0091212 A1 | 4/2009 | Ripoll et al. |

FOREIGN PATENT DOCUMENTS

| | | |
|---|---|---|
| DE | 19952950 A1 | 6/2001 |
| DE | 10155388 A1 | 5/2003 |
| DE | 10215630 A1 | 10/2003 |
| DE | 10303779 A1 | 7/2004 |
| DE | 10321208 A1 | 12/2004 |
| DE | 10328623 A1 | 1/2005 |
| DE | 102011077799 A1 | 12/2012 |
| EP | 0871230 A1 | 10/1998 |
| FR | 2831727 A1 | 5/2003 |
| JP | 2002247864 A | 8/2002 |

* cited by examiner

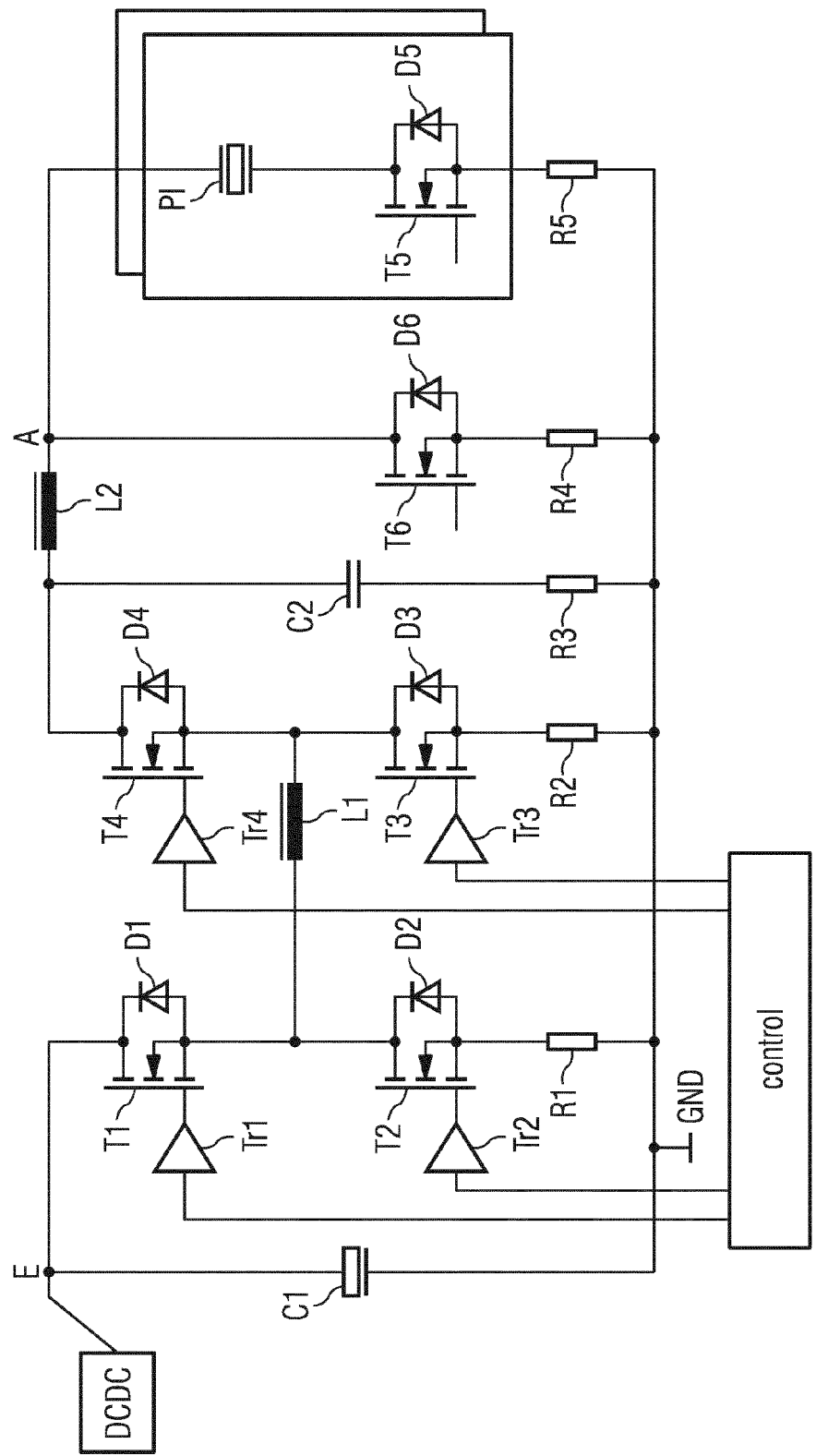

METHOD OF OPERATING A CAPACITIVE ACTUATOR IN A MOTOR VEHICLE

BACKGROUND OF THE INVENTION

Field of the Invention

In modern internal combustion engines with fuel injection, the fuel injectors used should be capable of responding as far as possible without delay. This demand is met by capacitive actuators and in this case in particular capacitively acting piezoelectric elements. Such capacitive actuators represent a high capacitive load for the corresponding voltage supply circuit, and this load needs to be charged to a preset voltage in a very short period of time and then needs to be discharged again very quickly. In addition, the actuation and therefore the charging need to be possible in a very precise and reproducible manner, with the result that defined injection can be realized even for very small fuel quantities. In order to open the corresponding fuel injector, the capacitive actuator is charged to a specific charge and, in order to close the corresponding fuel injector, the actuator is discharged again.

In order to drive piezoelectric actuators, it is conventional to use an apparatus for charging and discharging as is described in EP 0 871 230 B1. In said document, a capacitor is charged from a DC-to-DC converter, which steps up the battery voltage of the vehicle. A piezoelectric actuator is charged or discharged via a series circuit comprising two power switching elements which is connected in parallel with the capacitor and via an inductor coil. In this circuit, however, the piezoelectric actuator can be charged at most to the value of the voltage across the capacitor, with the result that the DC-to-DC converter needs to be designed to be correspondingly powerful, which is costly.

As an alternative to this, there are actuation units for capacitive actuators which, as described in DE 199 52 950 A1, are formed by a transformer and in which, in a first actuation phase, energy is stored in the transformer and, in a second phase, is transferred to the capacitive actuating element by virtue of the breakdown of the magnetic field in the transformer. This arrangement which is referred to as a flyback converter is operated as a boost converter, i.e. can provide markedly higher voltages at its output than are present at its input. However, an expensive transformer is required for this.

A further alternative is described in DE 103 28 623 A1, which represents a combination of a boost converter with a flyback converter by virtue of the output-side inductor coil of a buck converter in accordance with EP 0 871 230 B1 being coupled inductively weakly to an input-side inductor coil. The converter circuit therein is formed by power elements interconnected to form a half bridge, but is also intended to have the capacity of being operated by a full bridge, wherein it is not clear, however, how these power elements are intended to be interconnected.

DE 199 27 087 A1, DE 101 55 388 A1 and DE 102 15 630 A1 disclose apparatuses for charging and discharging piezoelectric injectors comprising a capacitor, which is arranged between an input connection of the apparatus and a reference potential, comprising a first series circuit comprising a first and a second power semiconductor element, which series circuit is connected in parallel with said capacitor, and comprising a coil, whose connection is connected to the center tap of the first series circuit, wherein the second connection of the coil is connected to the reference potential via a third power switching element and to a piezoelectric injector via a fourth power switching element, wherein diodes are connected in parallel with the power switching elements in such a way that said diodes are polarized in the reverse direction from the input connection or from the output connection to the reference potential.

In order to charge a piezoelectric injector, the first and fourth power switching elements are actuated, as a result of which a current can flow from the capacitor through the coil into the piezoelectric injector, as a result of which said piezoelectric injector is charged. However, it is also possible here, as in EP 0 871 230 B1, for the piezoelectric injector to be charged at most to the value of the voltage across the capacitor.

BRIEF SUMMARY OF THE INVENTION

It is therefore the object of the invention to specify a method for operating a capacitive actuator which avoids the disadvantages of the prior art.

The object is achieved, as claimed, by a method for operating a capacitive actuator, which is connected to an output connection of an apparatus, which is formed by a first capacitor, which is arranged between an input connection of the apparatus and a reference potential, by a first series circuit comprising a first and a second power switching element, which series circuit is connected in parallel with said capacitor, by a first coil, whose first connection is connected to the center tap of the first series circuit and whose second connection is connected to the reference potential via a third power switching element and to the output connection via a fourth power switching element, wherein diodes are connected in parallel with the power switching elements in such a way that they are polarized in the reverse direction from the input connection or from the output connection to the reference potential. In a manner according to the invention, in order to charge the capacitive actuator, first the first and third power switching elements are turned on by a control circuit so that a current can flow from the first capacitor via the first coil, as a result of which energy is stored in the coil, and when a preset maximum current value is reached, the previously switched-on first and third power switching elements are switched off again so that the magnetic energy stored in the first coil decays as a result of a current flow via the diode of the second power switching element and the diode of the fourth power switching element, as a result of which the capacitive actuator charges to a corresponding voltage, and by possibly repeated switching-on and switching-off of the first and third power switching elements, the capacitive actuator is charged to a preset voltage.

In an advantageous development of the invention, in order to discharge the capacitive actuator, the second and fourth power switching elements are switched on by the control circuit so that a current flows from the capacitive actuator via the first coil to the reference potential.

This operation according to the invention of the apparatus comprising power switching elements which are interconnected to form a full bridge and which are preferably in the form of power transistors with inverse diodes, enables optimization of all of the switching elements in respect of the maximum voltage required. Full-bridge circuits minimize the rated voltage for all internal circuit nodes and keep the internal insulating distances as small as possible.

The method according to the invention can be used in an apparatus comprising a plurality of capacitive actuators in a parallel circuit, wherein advantageously a selector switching element is arranged in series with each capacitive actuator so that the actuators can be actuated in a targeted manner.

The invention will be explained in more detail below with reference to an exemplary embodiment with the aid of a FIGURE, in which:

BRIEF DESCRIPTION OF THE DRAWING

The FIGURE shows a basic circuit diagram of an apparatus for application with a method according to the invention.

DESCRIPTION OF THE INVENTION

The FIGURE shows an apparatus designed for charging and discharging a capacitive actuator in the form of a piezoelectric injector PI, in which apparatus a first capacitor C1, which is arranged between an input connection E and a reference potential GND, is connected to a DC-to-DC converter DCDC and can be charged to an input voltage thereby. The DC-to-DC converter DCDC for its part generates the correspondingly required input voltage of the apparatus from, for example, the battery voltage of a motor vehicle.

The series circuit comprising a first power switching element in the form of an n-channel MOS power transistor T1, a second power switching element likewise in the form of an n-channel MOS transistor T2 and a first current-measuring circuit R1 in the form of a shunt resistor is interconnected in parallel with the first capacitor C1. The first connection of a first coil L1 is connected to the center tap of the first series circuit comprising the first and second power switching elements T1, T2, while the second connection of the first coil L1 for its part is connected to the reference potential GND via a third power switching element in the form of an n-channel MOS power transistor T3 and via a second current-measuring element R2, which is connected in series therewith and is in the form of a shunt resistor. The second connection of the first coil L1 is secondly connected to the output connection A of the apparatus via a fourth power switching element which is likewise in the form of an n-channel MOS power transistor T4 and via a second coil L2 connected in series therewith.

That connection of the fourth power switching element T4 which is not connected to the first coil L1 is connected to the reference potential GND via a second capacitor C2 and a third current-measuring element R3 in the form of a shunt resistor. The second capacitor C2 and the second coil L2 form a low-pass filter in order to smooth current and voltage peaks occurring as a result of switching operations of the power switching elements T1-T4.

The current-measuring elements R1 to R3 and also further current-measuring elements can also be formed by current mirrors or any other means for current detection which is conventional to a person skilled in the art instead of by shunt resistors. In illustration in FIG. 1, they are provided in all current branches leading to the reference potential GND, but some of them can also be omitted if a corresponding current is not of interest or can be provided in other branches.

In particular, in configurations of the apparatus, the second and third power switching elements T2, T3 or the third power switching element T3 and the second capacitor C2 can be connected to the reference potential GND via in each case only one common current-measuring element since a current does not flow simultaneously through the corresponding current paths during proper operation.

In the circuit illustrated in FIG. 1, the series circuit comprising a capacitive actuator in the form of a piezoelectric injector PI and a selector power switching element T5, which is likewise in the form of an n-channel MOS power transistor, as well as a current-measuring element R5, which is likewise in the form of a shunt resistor, is arranged between the output connection A of the apparatus and the reference potential GND.

The boxing around the series circuit comprising the piezoelectric injector PI and the selector power switching element T5 and the boxing illustrated behind this indicate that a plurality of such piezoelectric injectors can be connected in parallel with the apparatus illustrated and one of said piezoelectric injectors can be selected by corresponding actuation of the associated selector switch T5. In the case of a plurality of piezoelectric injectors PI connected in parallel, each can have a shunt resistor connected in series or else all piezoelectric injectors are connected to the shunt resistor R5 illustrated. This is possible since generally only one piezoelectric injector is selected at a time.

A sixth power switching element T6 is interconnected in series with a fourth current-measuring element R4 in the form of a shunt resistor between the output connection A of the apparatus and the reference potential. The piezoelectric injector(s) can possibly be discharged quickly by means of this sixth power switching element T6.

The shunt resistors R1-R3 are used for detecting the current flowing through the respective current branch in order to be able to use the voltage drop across said resistors to regulate the voltage across the piezoelectric injector in a control circuit Control. The control circuit Control for this purpose actuates the control inputs of the power switching elements T1-T4 in a known manner via corresponding lines and driver circuits TR1-TR4. The connecting lines of corresponding taps of the shunt resistors R1 to R5 to the control circuit Control are omitted for reasons of clarity.

In each case one diode D1-D6 is connected in parallel with the power switching elements T1-T6, to be precise in such a way that said diodes are interconnected with reverse polarity between the input connection E and the reference potential GND or between the output connection A and the reference potential GND. When using the n-channel MOS power transistors illustrated, these diodes D1-D6 are provided as intrinsic diodes in respect of technology.

In order to charge a piezoelectric injector PI in accordance with the invention, first the first and third n-channel MOS power transistors T1, T3 are switched on by the control circuit Control so that a current can flow from the first capacitor C1 via the first coil L1, as a result of which energy is stored in the coil L1. The current through the first coil L1 generally increases linearly, wherein, when a preset maximum current value is reached, which current value is determined by the first shunt resistor R1, the previously switched-on power transistors T1, T3 are switched off again. The magnetic energy stored in the first coil L1 decays as a result of a current flow via the diode D2 of the second power transistor T2 and the diode D4 of the fourth power transistor T4, which current flow flows, in smoothed form, through the filter circuit C2, L2 in the piezoelectric injector PI selected by actuation of the fifth power transistor T5 and charges said piezoelectric injector to a corresponding voltage. By repeatedly switching on and switching off the first and third power transistors T1, T3, the piezoelectric injector can be charged to a preset voltage by the number and duration of the switch-on operations corresponding to the measurement of the voltage at the piezoelectric injector PI by the control circuit Control.

For discharging, the second and fourth power transistors T2, T4 are correspondingly switched on by the control circuit Control so that a current can now flow from the piezoelectric injector PI via the second coil L2 and the first coil L1 to the reference potential GND. Once the second and fourth power transistors T2, T4 have been disconnected, the magnetic energy stored in the first coil L1 is stored back in the first capacitor C1 via the intrinsic diodes D1, D3 of the first and third power transistors T1, T3.

Since during discharge of the piezoelectric injector PI, a current is also flowing through the second (filter) capacitor C2 to the reference potential GND, the third current-measuring element R3 is provided in order to be able to determine the precise charge drawn by the piezoelectric injector PI from the sum of the currents through the second power switching element T2 and via the second capacitor C2.

The apparatus according to the invention can be operated in the continuous, discontinuous or else (preferred) resonant mode. It enables particularly advantageous operation if the voltage made available by the DC-to-DC converter DCDC at the input E of the apparatus approximately corresponds to the voltage required at the output A of the apparatus for supplying the piezoelectric injector PI.

The invention claimed is:

1. A method of operating a capacitive actuator, the method comprising:
   providing an apparatus with an output connection connected to the capacitive actuator and with an input connection, the apparatus further including:
      a capacitor connected between the input connection and a reference potential;
      a series circuit formed of a first and a second power switching element connected in parallel with the first capacitor;
      a coil having a first connection connected to a center tap of the first series circuit and having a second connection connected to the reference potential via a third power switching element and to the output connection via a fourth power switching element;
      diodes connected in parallel with the first, second, third, and fourth power switching elements and polarized in a reverse direction from the input connection or from the output connection to the reference potential;
   charging the capacitive actuator by first turning on the first and third power switching elements by a control circuit to cause a current to flow from the capacitor via the coil, and energy to be stored in the coil;
   when a preset maximum current value is reached, switching off the first and third power switching elements to cause the magnetic energy stored in the first coil to decay as a result of a current flow via the diode of the second power switching element and the diode of the fourth power switching element, to thereby charge the capacitive actuator to a corresponding voltage; and
   repeatedly switching-on and switching-off the first and third power switching elements for charging the capacitive actuator to a preset voltage.

2. The method according to claim 1, which comprises discharging the capacitive actuator by switching on the second and fourth power switching elements by the control circuit to cause a current to flow from the capacitive actuator via the first coil to the reference potential.

* * * * *